US005578965A

United States Patent [19]

Kimura

[11] Patent Number: 5,578,965

[45] Date of Patent: Nov. 26, 1996

[54] TUNABLE OPERATIONAL TRANSCONDUCTANCE AMPLIFIER AND TWO-QUADRANT MULTIPLIER EMPLOYING MOS TRANSISTORS

[75] Inventor: Katsuji Kimura, Tokyo, Japan

[73] Assignee: NEC Corporation, Tokyo, Japan

[21] Appl. No.: 477,257

[22] Filed: Jun. 7, 1995

[30] Foreign Application Priority Data

Jun. 13, 1994 [JP] Japan .................................... 6-130466
Jun. 13, 1994 [JP] Japan .................................... 6-130467

[51] Int. Cl.$^{6}$ ........................................................ H03F 3/45

[52] U.S. Cl. .......................... 330/254; 327/357; 327/359; 330/253

[58] Field of Search .................................... 330/253, 254, 330/311; 327/357, 359

[56] References Cited

U.S. PATENT DOCUMENTS 4,780,630 10/1988 Corpechot et al. ................ 330/253 X

FOREIGN PATENT DOCUMENTS 97307 4/1991 Japan .................................... 330/254

OTHER PUBLICATIONS

Klaas Bult et al., "A CMOS Four-Quadrant Analog Multiplier", *IEEE Journal of Solid-State Circuits*, vol. SC-21, No. 3, Jun. 1986, pp. 430-435.

Zhenhua Wang et al., "A Voltage-Controllable Linear MOS Transconductor Using Bias Offset Technique", *IEEE Journal of Solid-State Circuits*, vol. 25, No. 1, Feb. 1990, pp. 315-317.

*Primary Examiner*—James B. Mullins
*Attorney, Agent, or Firm*—Sughrue, Mion, Zinn, Macpeak & Seas

[57] ABSTRACT

A tunable MOS operational transconductance amplifier which outputs a differential output current in response to a differential input voltage. The amplifier has a tail current source, a first transistor pair, a second transistor pair and a third transistor pair. The sources of the first and second transistor pairs are connected in common to the tail current source. The third transistor pair is connected in cascode to the first transistor pair. The gates of the second transistor pair are connected to drains of the first transistor pair, respectively. The gates of one of the first transistor pair are connected to each other and a tuning voltage is applied to the gates of the one pair. The differential input voltage is applied between the gates of the other of the first transistor pair and the third transistor pair. The differential output current of the amplifier includes at least the differential drain current of the second transistor pair.

21 Claims, 14 Drawing Sheets

TUNABLE OPERATIONAL TRANSCONDUCTANCE AMPLIFIER AND TWO-QUADRANT MULTIPLIER EMPLOYING MOS TRANSISTORS

BACKGROUND OF THE INVENTION

1. Field of the Invention

This invention relates to a tunable operational transconductance amplifier (OTA) constructed using MOS (metal-oxide-semiconductor) field effect transistors and a two-quadrant multiplier constituted from a circuit similar to the OTA, and more particularly to a tunable OTA and a two-quadrant multiplier constructed on a semiconductor integrated circuit.

2. Description of the Prior Art

A transconductance amplifier outputs a current which increases in proportion to an input voltage, and is a functional element which is essentially required in analog signal processing. Among various transconductance amplifiers, a tunable OTA whose gain increases in proportion to a controlling voltage (tuning voltage) has a high utility value and is employed widely in semiconductor integrated circuits and large scale integrated circuits (LSIs). Further, the tunable OTA can be employed also as a multiplier because it generates an output current which increases in proportion to the product of an input voltage and a controlling voltage.

As one of tunable OTAs, a circuit proposed by Z. Wang and W. Guggenbuhl, in IEEE Journal of Solid-State Circuits, Vol. 25, No. 1, pp.315–317, February 1990 is known. FIG. 1 shows the construction of the MOS OTA by Wang et al. The circuit includes eight MOS transistors M1 to M8 having same characteristics. The sources of MOS transistors M1 to M4 are connected in common to a power source $V_{SS}$ through a constant current source 11 of a current $2I_{SS}$. In particular, a quadritail cell is constituted from transistors M1 to M4. Transistors M5 and M7 are connected in series and interposed between another power source $V_{DD}$ and the power source $V_{SS}$. Similarly, transistors M6 and M8 connected in series are interposed between the power sources $V_{DD}$ and $V_{SS}$. The voltages of the power sources $V_{DD}$ and $V_{SS}$ are +5 V and −5 V, respectively.

The gates of transistors M1 and M5 are connected in common to an input terminal A. The gates of transistors M2 and M4 are connected commonly to another input terminal B. Further, the gates of transistors M7 and M8 are connected commonly to a further input terminal C for inputting a tuning voltage. The gate of transistor M3 is connected to the source of transistor M5, and the gate of transistor M4 is connected to the source of transistor M6. The drains of transistors M1 and M4 are connected to each other, and the sum of the drain currents of transistors M1 and M2 is represented by $I_1$. Similarly, the drains of the transistors M2 and M3 are connected commonly, and the sum of the drain currents of the transistors M2 and M3 is represented by $I_2$.

In the present OTA, a differential input voltage is applied between the input terminals A and B, and a tuning voltage $V_B$ is applied between the input terminal C and the power source $V_{SS}$. A differential current ΔI between the currents $I_1$ and $I_2$ represents an output value.

The drain current of an MOS transistor operating in saturation is, ignoring a channel length modulation and a body effect, given by $$I_{Di} = \beta (V_{GSi} - V_{TH})^2 \qquad (V_{GSi} >= V_{TH}) \qquad (1)$$
$$I_{Di} = 0 \qquad (V_{GSi} <= V_{TH})$$

where β is a transconductance parameter and is given by $\beta=\mu(C_{OX}/2)(W/L)$. μ is the effective mobility of carriers, $C_{OX}$ is the gate oxide film capacitance per unit area, and W and L are the gate width and the gate length, respectively. Further, $V_{TH}$ represents the threshold voltage, and $V_{GSi}$ represents the gate-source voltage of the i-th transistor.

Since the transistors have same characteristics and the equal tuning voltage $V_B$ is applied to the gates of transistors M7 and M8, the drain currents of the two transistors M7 and M8 are equal to each other. Where the drain current value is represented by $I_B$, also the drain currents of transistors M5 and M6 are equal to $I_B$. Consequently, both of the gate-to-source voltages $V_{GS5}$ and $V_{GS6}$ of the transistors M5 and M6 are equal to the tuning voltage $V_B$. Accordingly, the drain currents $I_{D1}$ to $I_{D4}$ of the transistors M1 to M4 are represented as given by the following equations:

$$I_{D1}=\beta(V_i/2+V_R-V_S-V_{TH})^2 \qquad (2)$$

$$I_{D2}=\beta(-V_i/2+V_R-V_S-V_{TH})^2 \qquad (3)$$

$$I_{D3}=\beta(V_i/2-V_B+V_R-V_S-V_{TH})^2 \qquad (4)$$

$$I_{D4}=\beta(-V_i/2-V_B+V_R-V_S-V_{TH})^2 \qquad (5)$$

where $V_i$ is the input differential voltage, $V_R$ is the midpoint voltage (dc voltage) of the input signal, and $V_S$ is the common source voltage.

From the requirement for the tail currents, the following equation stands:

$$I_{D1}+I_{D2}+I_{D3}+I_{D4}=I_o \qquad (6)$$

After all, the differential output current ΔI of the tunable MOS OTA is represented by the following equation:

$$\Delta I = I_1 - I_2 = (I_{D1} + I_{D4}) - (I_{D2} + I_{D3}) \qquad (7)$$

-continued $$
= \begin{cases}
2\beta V_B V_i \left( |V_i| \leqq -\frac{V_B}{2} + \sqrt{\frac{I_{SS}}{\beta} - \frac{3}{4} V_B^2} \right) \\
\frac{4}{3} \beta V_B V_i - \frac{1}{9} sgn(V_i) \left\{ 6 I_{SS} + \beta (|V_i| + V_B)^2 \right. \\
\left. -4\beta(|V_i| + V_B) \sqrt{\frac{6 I_{SS}}{\beta} - 2(|V_i| + V_B)^2 + 6 V_B |V_i|} \right\} \\
\left( -\frac{V_B}{2} + \sqrt{\frac{I_{SS}}{\beta} - \frac{3}{4} V_B^2} \leqq |V_i| \leqq \frac{5 V_B}{6} + \sqrt{\frac{I_{SS}}{\beta} - \frac{11}{36} V_B^2} \right) \\
\left( \beta V_B \sqrt{\frac{2 I_{SS}}{\beta} - V_B^2} \right) sgn(V_i) \\
\left( |V_i| \geqq \frac{5 V_B}{6} + \sqrt{\frac{I_{SS}}{\beta} - \frac{11}{36} V_B^2} \right)
\end{cases}
$$

As can be seen from equation (7), assuming that the square-law of the input/output characteristic of an MOS field effect transistor stands, the circuit operates linearly and the different output current $\Delta I$ increases in proportion to the product of the differential input voltage $V_i$ and the tuning voltage $V_B$ within an input voltage range in which none of the MOS transistors in the circuit cuts off. As the differential input voltage $V_i$ becomes higher, the MOS transistors in the circuit begin to enter a cutoff condition and the circuit goes out of linear operation.

FIG. 2 shows the transfer characteristic of the conventional MOS OTA described above using the tuning voltage $V_B$ as a parameter based on equation (7). It can be seen from FIG. 2 that, when the input voltage is high, the differential output current $\Delta I$ is limited by the tail current. Further, the transconductance characteristic of the conventional MOS OTA is obtained, by differentiating equation (7) by the input voltage $V_i$, as given by the following equation:

$$
\frac{d(\Delta I)}{dV_i} = \begin{cases}
2\beta V_B \left( |V_i| \leqq -\frac{V_B}{2} + \sqrt{\frac{I_{SS}}{\beta} - \frac{3}{4} V_B^2} \right) \\
\frac{4}{3} \beta V_B - \frac{4}{9} \beta sgn(V_i) \left\{ (|V_i| + V_B) \right. \\
-2\beta \sqrt{\frac{6 I_{SS}}{\beta} - 2(|V_i| + V_B)^2 + 6 V_B V_i} + \\
\left. \frac{4\beta(|V_i| + V_B)^2}{\sqrt{\frac{6 I_{SS}}{\beta} - 2(|V_i| + V_B)^2 + 6 V_B V_i}} \right\} \\
\left( -\frac{V_B}{2} + \sqrt{\frac{I_{SS}}{\beta} - \frac{3}{4} V_B^2} \leqq |V_i| \leqq \frac{5 V_B}{6} + \sqrt{\frac{I_{SS}}{\beta} - \frac{11}{36} V_B^2} \right) \\
0 \left( |V_i| \geqq \frac{5 V_B}{6} + \sqrt{\frac{I_{SS}}{\beta} - \frac{11}{36} V_B^2} \right)
\end{cases} \quad (8)
$$

FIG. 3 shows the transconductance characteristic obtained in this manner using the tuning voltage $V_B$ as a parameter.

By the way, in a semiconductor integrated circuit or a large scale integrated circuit, miniaturization of a circuit pattern is proceeding, and as the miniaturization proceeds, also the power source voltage used decreases from the conventional voltage of 5 V to 3.3 V or further to 3 V. Consequently, the necessity for circuits which operate at a low voltage is further increasing. A CMOS process as an LSI manufacturing process is recognized as an optimum process technology, and it is demanded to realize an OTA of the CMOS configuration. Further, for the conventional OTA described above, it is demanded to decrease the number of transistors constituting the circuit or expand the range of the linear operation.

A multiplier can be constructed using a tunable OTA, and as one of MOS multipliers, a circuit is revealed by K. Bult and H. Wallinga in IEEE Journal of Solid-State Circuits, Vol. SC-21, No. 3, pp.430–435, June 1986 is known. K. Bult et al. discloses both of a two-quadrant multiplier and a four-quadrant multiplier. FIG. 4 is a circuit diagram showing an example of the construction of the two-quadrant multiplier by K. Bult et al.

The multiplier includes six MOS transistors M1 to M6 having same characteristics. The sources of transistors M1 to M4 are grounded in common. Transistors M5 and M6 are connected in series to the drains of transistors M1 and M2, respectively. The drains of transistors M3 and M6 are connected to each other, and a combined current of the drain currents of them is represented by $I_L$. Similarly, the drains of transistors M4 and M5 are connected to each other, and the sum of the drain currents of them is represented by $I_R$. Further, input voltages $V_1$ and $V_1'$ are applied to the gates of transistors M1 and M2, respectively. The input voltages $V_1$ and $V_1'$ define a differential input voltage. The gates of transistors M5 and M6 are connected to each other, and a second input voltage $V_2$ is applied to them. Further, the gates of transistors M3 and M4 are connected to the drains of transistors M1 and M2, respectively. The two-quadrant multiplier by the K. Bult and H. Wallinga can be regarded as being constructed as a combination of a first voltage-controlled V-I converter constituted from transistors M1, M3 and M5 and a second voltage-controlled converter constituted from transistors M2, M4 and M6.

If it is assumed that the drain current of a MOS transistor operates in accordance with equation (1) given above, drain currents $I_{D1}$ to $I_{D4}$ of the transistors are represented as given by the following equations:

$$I_{D1}=\beta(V_1-V_{TH})^2 \tag{9}$$

$$I_{D2}=\beta(V_1'-V_{TH})^2 \tag{10}$$

$$I_{D3}=\beta(V_2-V_1-V_{TH})^2 \tag{11}$$

$$I_{D4}=\beta(V_2-V_1'-V_{TH})^2 \tag{12}$$

Accordingly, the differential output current ΔI is represented as $$\begin{aligned}\Delta I &= I_L-I_R \\ &= (I_{D2}+I_{D3})-(I_{D1}+I_{D4}) \\ &= 2\beta V_i(2V_{TH}-V_C)\end{aligned} \tag{13}$$

where $V_1=V_{R1}+V_i/2$, $V_1'=V_{R1}-V_i/2$, and $V_2=V_C$. Further, $V_{R1}$ is the reference voltage with respect to the differential input voltage.

Here, since $V_{TH}$ is a fixed value, the conventional MOS two-quadrant multiplier shown in FIG. 4 outputs, ignoring the threshold level $V_{TH}$, the differential current ΔI which increases in proportion to the product of the differential input voltage $V_i$ and the second input voltage $V_2$.

Also for MOS two-quadrant multipliers, it is demanded to expand the range of linear operation and allow operation at a further decreased voltage.

SUMMARY OF THE INVENTION

It is a first object of the present invention to provide an MOS OTA which is superior in linearity and can be realized with a circuit configuration of a comparatively small scale.

It is a second object of the present invention to provide an MOS two-quadrant multiplier which is superior in linearity and allows an input voltage signal to be applied easily.

The first object of the present invention described above is attained by a tunable MOS operational transconductance amplifier which outputs a differential output current in response to a differential input voltage, comprising a tail current source, first and second transistor pairs connected commonly at sources thereof and driven by the tail current source, and a third transistor pair connected in cascode to the first transistor pair and serving as loads to the first transistor pair, gates of the second transistor pair being connected to drains of the first transistor pair, a tuning voltage being applied to gates of one of the first transistor pair and the third transistor pair which are connected commonly while the differential input voltage is applied between the gates of the other of the first transistor pair and the third transistor pair, the differential output current including at least drain currents of the second transistor pair.

The first object of the present invention described above is attained also by a tunable MOS operational transconductance amplifier which outputs a differential output current in response to a differential input voltage, comprising a first tail current source, a second tail current source, first and second transistor pairs having drains cross-coupled to each other and having sources connected commonly to the first tail current source, and a differential pair constituted from transistors connected in cascode and connected to the second tail current source, gates of transistors on upper stage side constituting the differential pair being connected in common to be applied a tuning voltage thereto, sources of the transistors on the upper stage side being connected to the gates of the first transistor pair, respectively, gates of transistors on lower stage side which constitute the differential pair being connected to gates of the second transistor pair, respectively, the differential input voltage being applied between the gates of the second transistor pair.

The second object of the present invention described above is attained by a tunable MOS two-quadrant multiplier which outputs a differential output current in response to the product of values of two input voltages, comprising first and second transistor pairs having sources grounded commonly, and a third transistor pair connected in cascode to the first transistor pair and serving as loads to the first transistor pair, gates of the second transistor pair being individually connected to drains of the first transistor pair, a differential input voltage being applied as a first input voltage between gates of the third transistor pair, a second input voltage being applied to gates of the first transistor pair which are connected commonly, the differential output current including at least drain currents of the second transistor pair.

The second object of the present invention described above is attained also by a tunable MOS two-quadrant multiplier which outputs a differential output current in response to the product of values of two input voltages, comprising first and second transistor pairs having sources grounded commonly, and a third transistor pair connected in cascode to the first transistor pair and serving as loads to the first transistor pair, drains of the second transistor pair being connected not in cross-coupling to drains of the third transistor pair, gates of the second transistor pair being individually connected to drains of the first transistor pair, a differential input voltage being applied as a first input voltage between gates of the first transistor pair, a second input voltage being applied to gates of the third transistor pair which are connected commonly, the differential output current including at least drain currents of the second transistor pair.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

<<First Embodiment>>

Example 1

Figure 5:
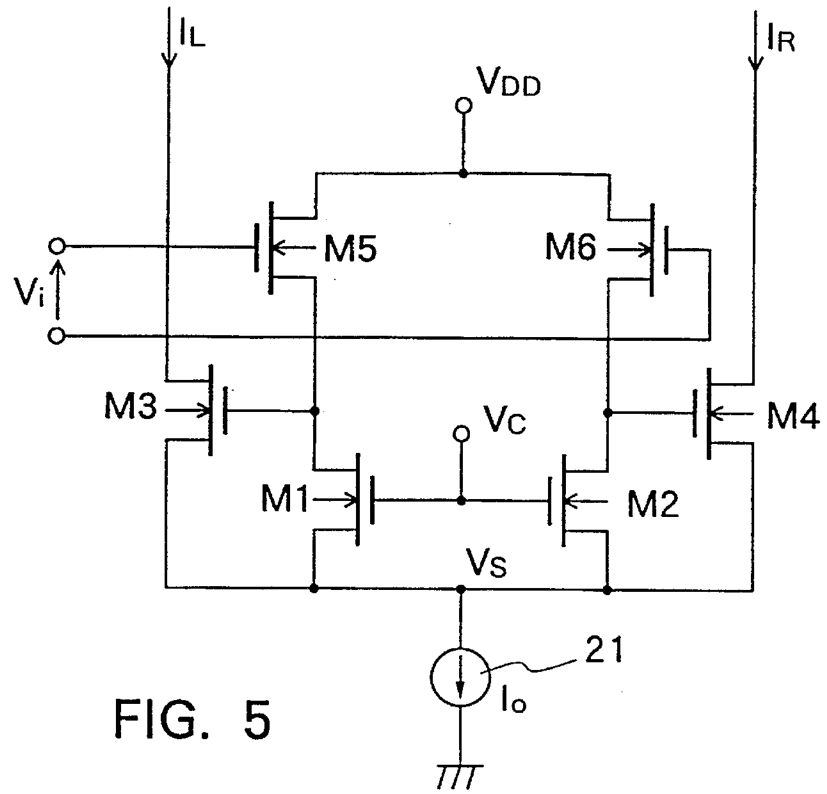
FIG. 5 is a circuit diagram showing the construction of an example of an MOS OTA according to a first embodiment of the present invention.

The MOS OTA of the first embodiment of the present invention includes six MOS transistors M1 to M6 as shown in FIG. 5. The sources of the four transistors M1 to M4 are connected to each other and grounded through a constant current source 21 whose current value is represented by $I_o$. Further, transistors M5 and M6 are connected as loads to the drains of transistors M1 and M2, respectively. The gates of transistors M3 and M4 are connected to the drains of transistors M1 and M2, respectively. Transistors M1 to M4 constitute a quadritail cell since they share a single tail current $I_o$. However, since transistors M5 and M6 are connected in cascode to transistors M1 and M2, the circuit of the type just described is hereinafter referred to as cascode quadritail cell.

The gates of transistors M1 and M2 are connected to each other, and a tuning voltage $V_C$ is applied to them. A differential input voltage $V_i$ is applied between the gates of transistors M5 and M6. Further, the drains of transistors M5 and M6 are connected in common to a power source voltage $V_{DD}$. Here, drain currents $I_{D3}$ and $I_{D4}$ of transistors M3 and M4 are represented as currents $I_L$ and $I_R$, respectively.

Where the gate-source voltage of the i-th transistor is represented by $V_{GSi}$ and the drain current of the i-th transistor is represented by $I_{Di}$, since $I_{D1}=I_{D2}$ and $V_{GS1}=V_{GS2}=V_{GS5}=V_{GS6}$ stand, drain currents $I_{D1}$ to $I_{D4}$ of transistors M1 to M4 are represented as given by the following equations:

$$I_{D1}=I_{D2}=\beta(V_C-V_S-V_{TH})^2 \quad (14)$$

$$I_{D3}=\beta(V_i/2+V_R-V_C-V_{TH})^2 \quad (15)$$

$$I_{D4}=\beta(-V_i/2+V_R-V_C-V_{TH})^2 \quad (16)$$

where $\beta$ is the transconductance parameter of the transistor, $V_R$ is the reference voltage corresponding to the midpoint voltage of the differential input voltage, and $V_{TH}$ is the threshold voltage.

Meanwhile, from the requirement for the tail currents, the following equation stands:

$$I_{D1}+I_{D2}+I_{D3}+I_{D4}=I_o \quad (17)$$

Accordingly, the differential input current $\Delta I$ is represented as $$\begin{aligned}\Delta I &= I_L-I_R \\ &= I_{D3}-I_{D4} \\ &= 2\beta V_i(V_R-V_C-V_{TH})\end{aligned} \quad (18)$$

The common source voltage $V_S$ relies upon the differential input voltage $V_i$ and is represented as $$V_S=V_C-V_{TH}-\sqrt{\frac{I_o}{2\beta}-\frac{1}{4}V_i^2-(V_R-V_C-V_{TH})^2} \quad (19)$$

However, the differential output current $\Delta I$ does not rely upon the common source voltage $V_S$ as seen from equation (18), and after all, the present circuit outputs the differential output current $\Delta I$ which increases in proportion to the input voltage $V_i$. In short, the present circuit operates linearly.

Examples 2 and 3

In the MOS OTA shown in FIG. 5 and described above, the difference between drain currents $I_{D3}$ and $I_{D4}$ of transistors M3 and M4 in pair is obtained as the differential output current $\Delta I$. However, the differential output current $\Delta I$ may be obtained by various other methods from the drain currents $I_{D1}$ to $I_{D4}$ of the quadritail cell. In the MOS OTA of Example 2 shown in FIG. 6, the upper side transistor of the cascoded transistor pairs and the other transistor pair constituting the quadritail cell are connected in parallel, and the drains of transistors M5 and M6 are connected to the drains of transistors M3 and M4, respectively. Accordingly, the output differential current $\Delta I$ of the present MOS OTA is represented as given below:

$$\begin{aligned}\Delta I &= I_L-I_R \\ &= (I_{D1}+I_{D3})-(I_{D2}+I_{D4}) \\ &= 2\beta V_i(V_R-V_C-V_{TH})\end{aligned} \quad (20)$$

Figure 7:
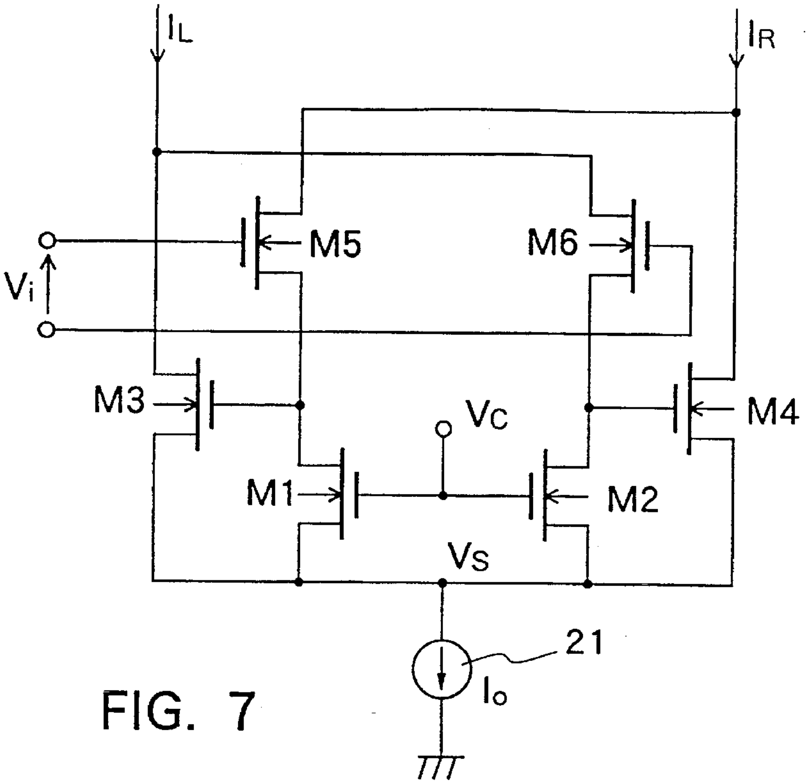

Meanwhile, in the MOS OTA of Example 3 shown in FIG. 7, the two transistor pairs constituting the quadritail cell are cross-coupled, and the drains of transistors M5 and M6 are connected to the drains of transistors M4 and M3, respectively. Accordingly, the output differential current $\Delta I$ of the present MOS OTA is represented as given below:

$$\begin{aligned}\Delta I &= I_L-I_R \\ &= (I_{D2}+I_{D3})-(I_{D1}+I_{D4}) \\ &= 2\beta V_i(V_R-V_C-V_{TH})\end{aligned} \quad (21)$$

Figure 6:
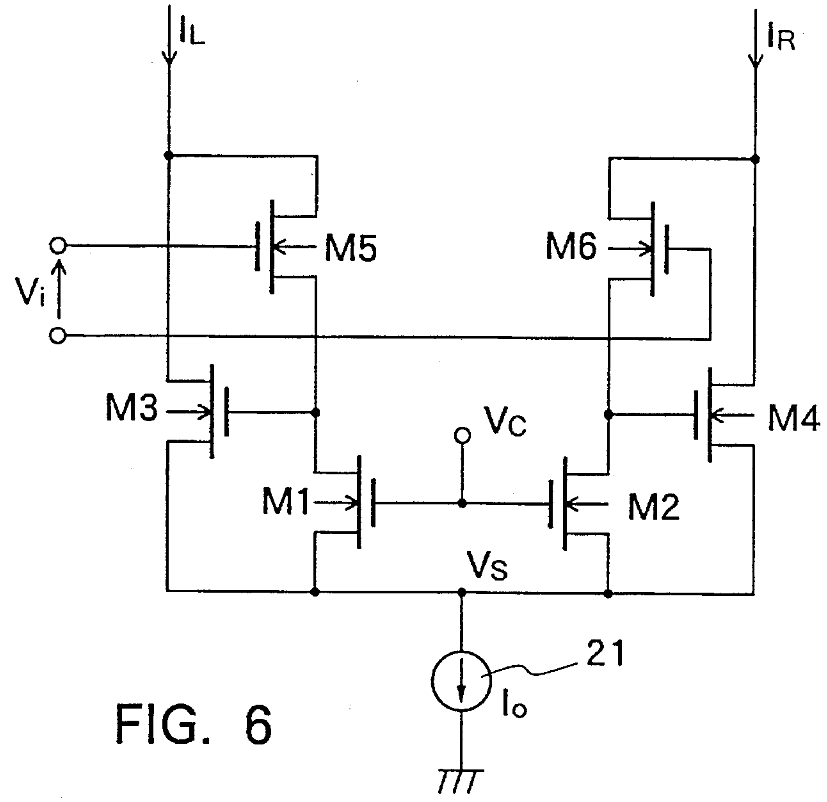
FIGS. 6, 7, 8, 9 and 10 are circuit diagrams individually showing different examples of the MOS OTA according to the first embodiment of the present invention.

As apparently seen from equations (20) and (21), both of the MOS OTAs shown in FIGS. 6 and 7 have a same input/output characteristic as that of the MOS OTA shown in FIG. 5 and operate linearly.

Example 4

While the MOS OTAs shown in FIGS. 5, 6 and 7 are constructed such that the differential input voltage $V_i$ is applied to that one of the two transistor pairs connected in cascode which is remote from the tail current source 21, it is possible to otherwise employ another construction wherein the differential input voltage $V_i$ is inputted to that transistor pair closer to the tail current source 21. While the MOS OTA of Example 4 shown in FIG. 8 has a similar construction to the OTA shown in FIG. 5, it is different in construction in that the differential input voltage $V_i$ is applied between the gates of transistors M1 and M2 and the tuning voltage $V_C$ is applied to the gates of transistors M5 and M6 which are connected to each other.

Since $V_{GS1}=V_{GS5}$, $V_{GS2}=V_{GS6}$, $I_{D1}=I_{D5}$ and $I_{D2}=I_{D6}$ stand with the construction just described, drain currents $I_{D1}$ to $I_{D4}$ of transistors M1 to M4 are represented as given below:

$$I_{D1}=\beta(V_i/2+V_R-V_S-V_{TH})^2 \quad (22)$$

$$I_{D2}=\beta(-V_i/2+V_R-V_S-V_{TH})^2 \quad (23)$$

$$I_{D3}=\beta(V_C-V_i/2-V_R-V_{TH})^2 \quad (24)$$

$$I_{D4}=\beta(V_C+V_i/2-V_R-V_{TH})^2 \quad (25)$$

Since equation (17) described above stands from the requirements for the tail current $I_o$, the differential output current ΔI is given by:

$$\begin{aligned}\Delta I &= I_L - I_R \\ &= I_{D3} - I_{D4} \\ &= 2\beta V_i(V_R - V_C - V_{TH})\end{aligned} \quad (26)$$

In the present circuit, the common source current $V_S$ relies upon the differential input voltage $V_i$ and is represented as given by the following equation:

$$V_S = V_R - V_{TH} - \sqrt{\frac{I_o}{2\beta} - \frac{1}{2}V_i^2 - (V_C - V_R - V_{TH})^2} \quad (27)$$

Since the common source voltage $V_S$ does not appear in equation (26), the present circuit operates linearly.

Example 5

Figure 9:
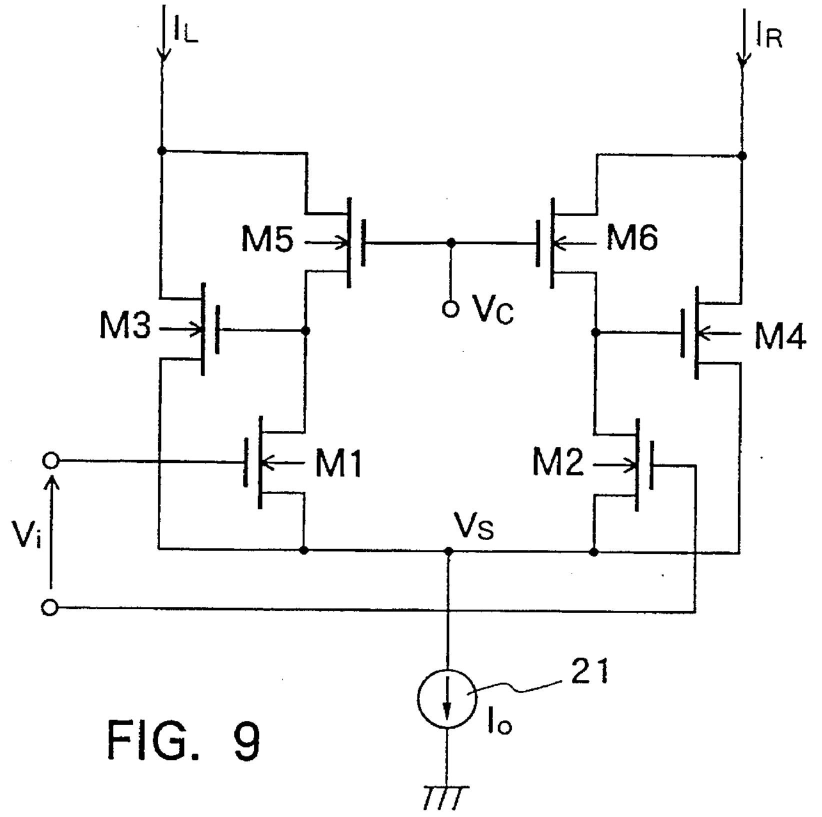

The MOS OTA of Example 5 shown in FIG. 9 employs a balanced-cascoded quadritail cell and is different in construction from the OTA shown in FIG. 6 in that the differential input voltage $V_i$ is applied between the gates of transistors M1 and M2 and the tuning voltage $V_C$ is applied to the gates of transistors M5 and M6 which are connected to each other. In the present circuit, equations (22) to (25) given above stand with regard to drain currents $I_{D1}$ to $I_{D4}$ of transistors M1 to M4, and further, equations (17) and (27) stand. Consequently, the differential output current ΔI is represented as given below:

$$\begin{aligned}\Delta I &= I_L - I_R \\ &= (I_{D1} + I_{D3}) - (I_{D2} + I_{D4}) \\ &= 2\beta V_i(2V_{R1} - V_C - V_S)\end{aligned} \quad (28)$$

In the present circuit, the common source voltage $V_S$ relies upon the differential input voltage $V_i$ as seen from equation (27), and the differential output current ΔI includes a term of the common source voltage $V_S$ as seen from equation (28). Accordingly, the term of the common source voltage $V_S$ is a non-linear term of the differential output current ΔI and deteriorates the linearity of the output of the circuit.

Example 6

Figure 10:
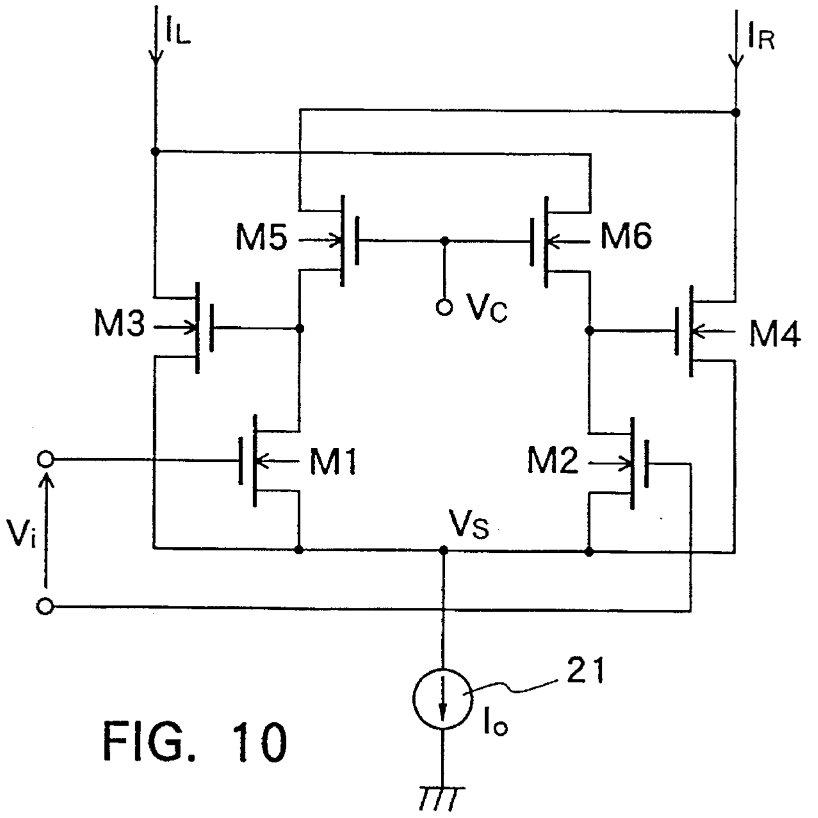

The MOS OTA of Example 6 shown in FIG. 10 employs an unbalanced-cascoded quadritail cell and is different in construction from the OTA shown in FIG. 7 in that the differential input voltage $V_i$ is applied between the gates of transistors M1 and M2 and the tuning voltage $V_C$ is applied to the gates of transistors M5 and M6 which are connected to each other. In the present circuit, equations (22) to (25) stand with regard to drain currents $I_{D1}$ to $I_{D4}$ of the transistors M1 to M4, and further, equations (17) and (27) stand. Consequently, the differential output current ΔI is represented as given below:

$$\begin{aligned}\Delta I &= I_L - I_R \\ &= (I_{D2} + I_{D3}) - (I_{D1} + I_{D4}) \\ &= 2\beta V_i(V_C - V_S - 2V_{TH})\end{aligned} \quad (28)$$

Also in the present circuit, the differential output current ΔI includes a term of the common source voltage $V_S$ similarly to the circuit shown in FIG. 9. Accordingly, this term is a non-linear term of the differential output current ΔI and deteriorates the linearity of the output of the circuit.

In the MOS OTAs of the first embodiment shown in FIGS. 5 to 10, a floating input is realized by driving the transistors with a constant current using a cascoded quadritail cell. Further, linear operation is realized with the MOS OTAs of Examples 1 to 4 shown in FIGS. 5 to 8, respectively. Meanwhile, with the MOS OTAs of Examples 5 and 6 shown in FIGS. 9 and 10, linear operation is not realized, and the linearity with respect to the tuning voltage is sacrificed.

<<Second Embodiment>>

Figure 11:
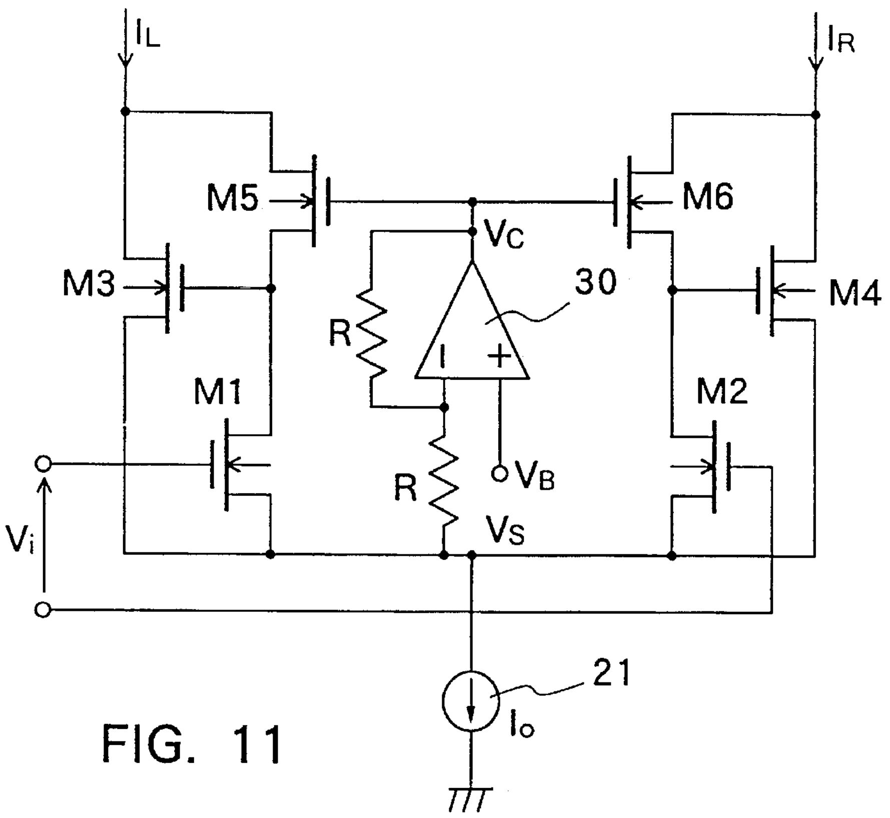
FIG. 11 is a circuit diagram showing the construction of an MOS OTA according to a second embodiment of the present invention.

As described above, with the MOS OTA shown in FIG. 9, linear operation cannot be realized since the differential output current ΔI is varied also by the common source voltage $V_S$. However, as apparently seen from equation (28), by applying a tuning voltage to a balanced-cascoded quadritail cell with reference to the common source voltage $V_S$, the term of the common source voltage $V_S$ can be eliminated from the equation representing the differential output current ΔI, and linear operation can be realized. In the MOS OTA of the second embodiment of the present invention shown in FIG. 11, the level of the control voltage $V_B$ inputted from the outside is shifted using an operational amplifier 30 so that a tuning voltage $V_C$ with reference to the common source voltage $V_S$ may be applied to the cascode quadritail cell. In particular, two resistors R having an equal resistance value and connected in series are interposed between the common gates of transistors M5 and M6 and the common sources of transistors M1 to M4, and the tuning voltage $V_B$ is inputted to the (+) input terminal of the operational amplifier 30 while the (−) input terminal of the operational amplifier 30 is connected to the midpoint of the two resistors R. Further, the output terminal of the operational amplifier 30 is connected commonly to the gates of transistors M5 and M6.

<<Third Embodiment>

Figure 12:
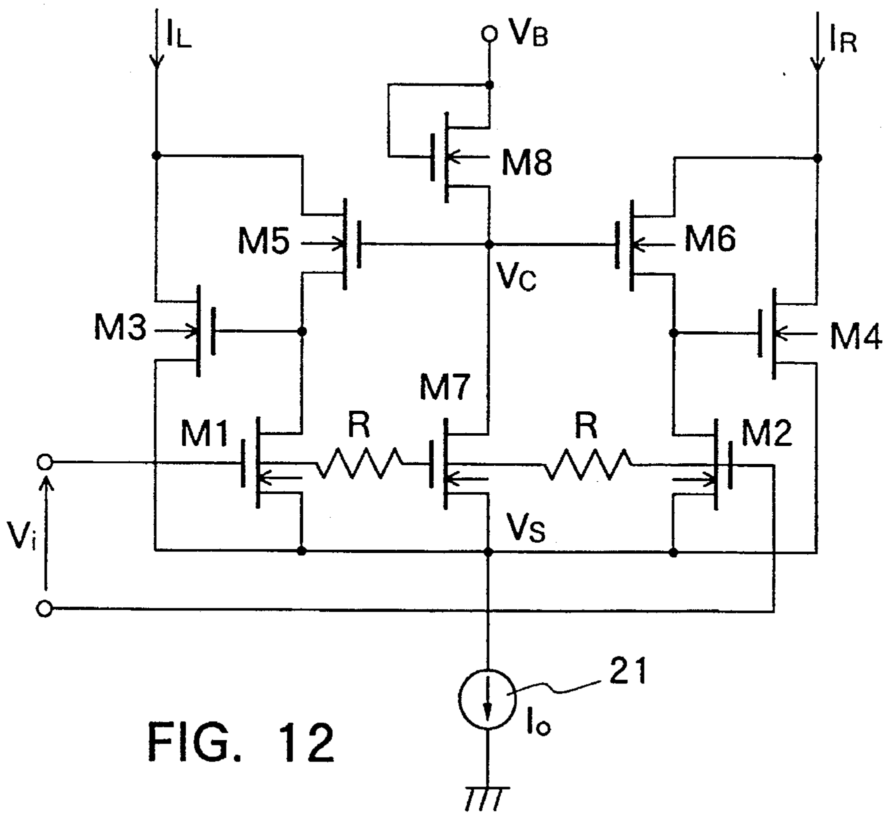
FIG. 12 is a circuit diagram showing the construction of an MOS OTA according to a third embodiment of the present invention.

The MOS OTA of the third embodiment of the present invention shown in FIG. 12 is a modification to the MOS OTA shown in FIG. 5 in that it additionally includes two MOS transistors M7 and M8 and two resistors R having an equal resistance value so that the tuning voltage $V_C$ may be applied to the cascode quadritail cell with reference to the common source voltage $V_S$. Transistors M7 and M8 are connected in series, and the source of transistor M7 is connected to the sources of transistors M1 to M4 while the drain and the gate of transistor M8 are connected to each other and the tuning voltage $V_B$ is applied to the drain and the gate of the transistor M8. The drain of transistor M7 is connected to the gates of the transistors M5 and M6. The two resistors R are interposed in series between the gate of transistor M1 and the gate of transistor M2, and the midpoint of the series connection is connected to the gate of transistor M7.

Since also transistor M7 shares the tail current source 11, the present circuit is accurately called balanced-cascoded quint-tail cell. The tuning voltage $V_C$ as measured from the grounding point, that is, the gate voltage of transistors M5 and M6 is given by $$V_C=V_B-V_R+V_S-V_{TH} \quad (30)$$

By substituting equation (30) into equation (28), it can be recognized that the differential output current ΔI in the present circuit does not rely upon the common source voltage $V_S$, and linear operation is realized.

<<Fourth Embodiment>

Figure 13:
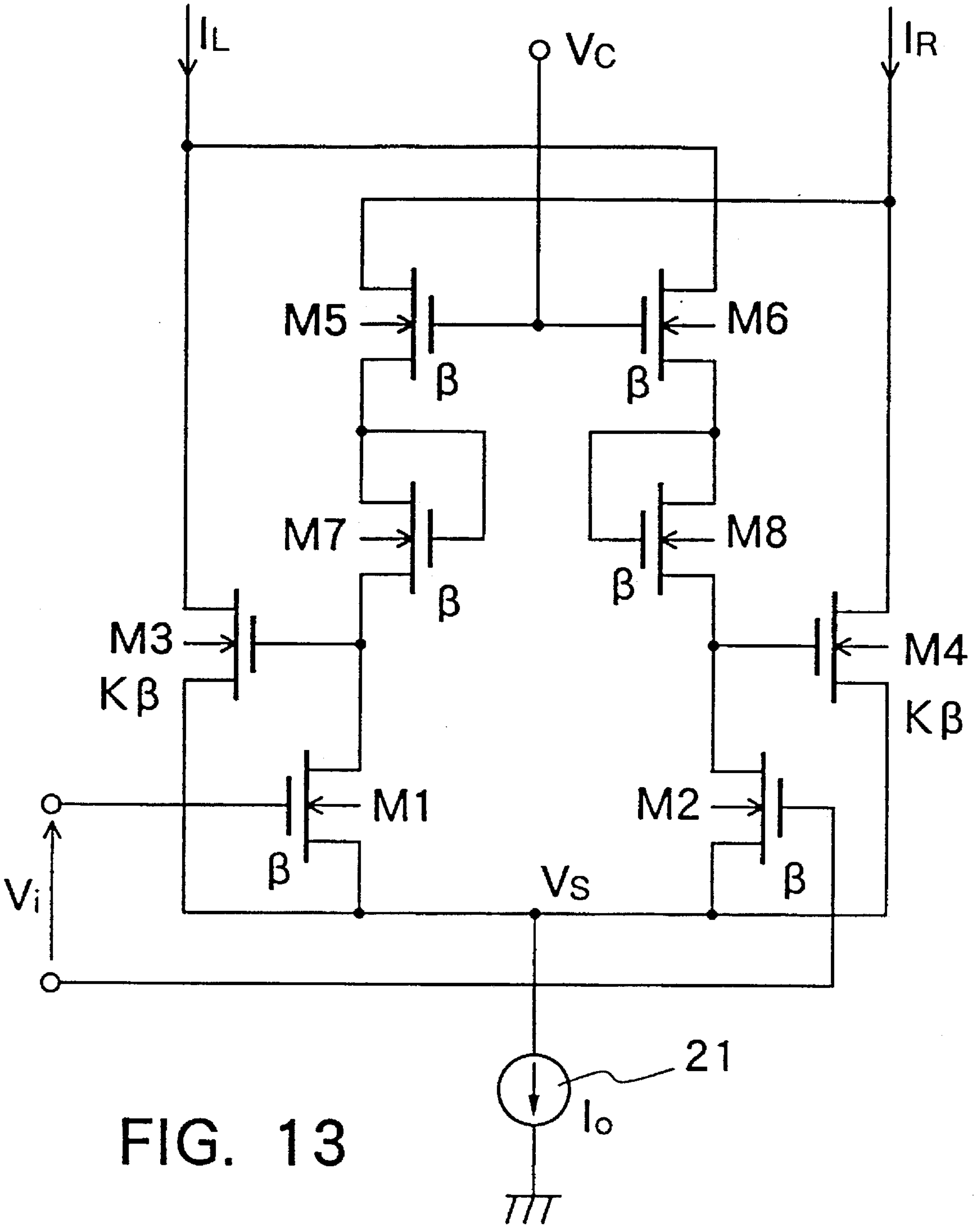
FIG. 13 is a circuit diagram showing an example of the construction of an MOS OTA according to a fourth embodiment of the present invention.

An MOS OTA (refer to FIG. 10) which employs an unbalanced-cascoded quadritail cell can be constructed as a circuit which does not rely upon the common source voltage $V_S$ by connecting transistors in cascode in three stages and varying the transistor sizes of them to vary the transconductance parameters. This circuit operates linearly. FIG. 13 shows an example of the circuit of the type just described. The circuit shown in FIG. 13 is a modification to the circuit shown in FIG. 10 in that an additional transistor M7 is interposed between transistors M1 and M5 and another additional transistor M8 is interposed between transistors M2 and M6, and while each of transistors M1, M2, M5, M6, M7 and M8 have a same transconductance parameter β, the transistors M3 and M4 have another transconductance parameter Kβ. The drain and the gate of transistor M7 are connected to each other, and similarly, the drain and the gate of transistor M8 are connected to each other. When K=½, the differential output current ΔI of the present unbalanced-double-cascoded quadritail cell is given by $$\Delta I=4\beta V_i(V_C-V_R-2V_{TH}) \quad (31)$$

Particularly, in order to achieve K=½, the ratio between the width W and the length L of the gates of transistors M3 and M4 should be equal to one half the W/L ratio of the other transistors M1, M2, M5 and M6.

Figure 14:
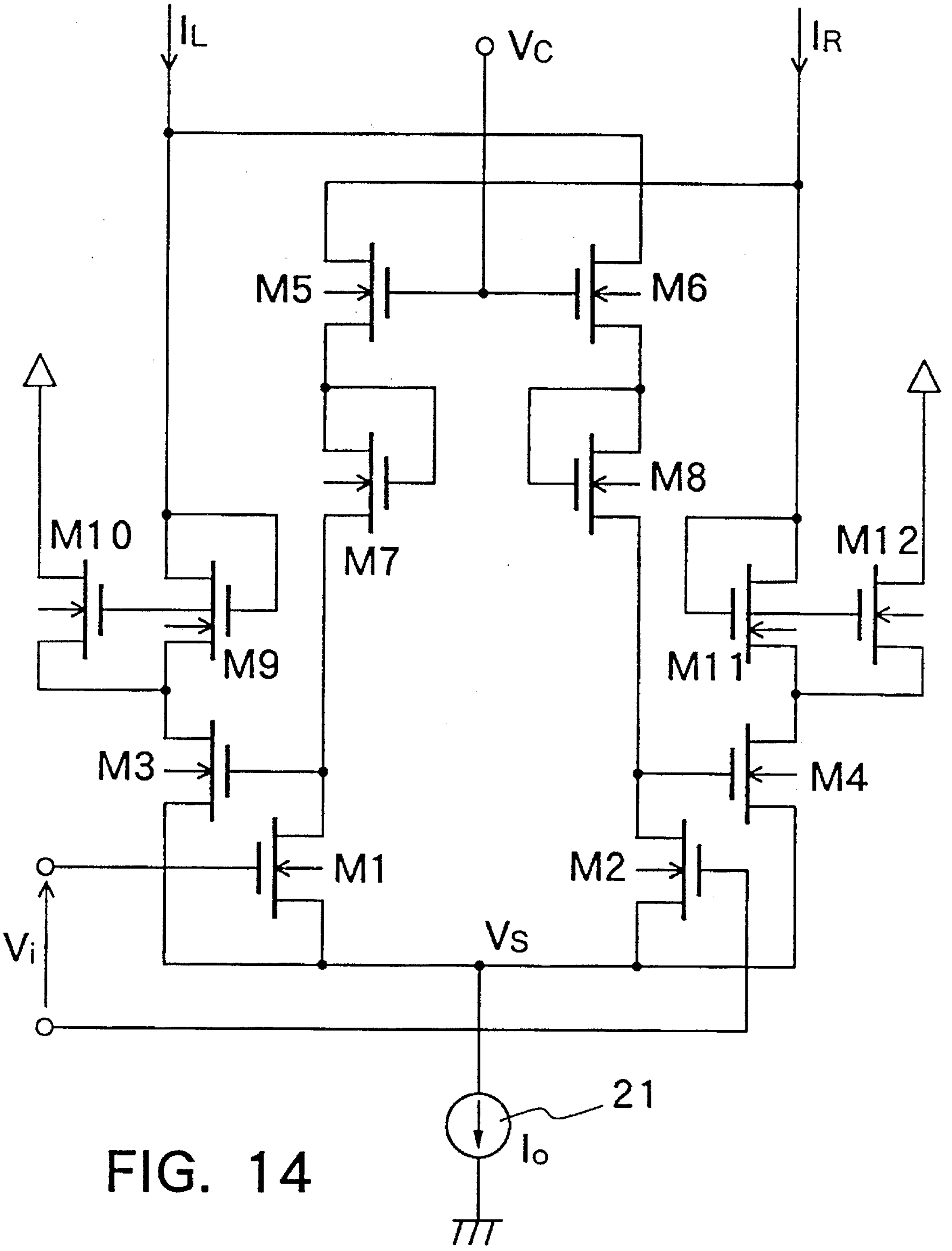
FIG. 14 is a circuit diagram showing another example of the construction of the MOS OTA according to the fourth embodiment of the present invention.

Or, in order to construct a circuit similar to that shown in FIG. 13 using transistors of an equal size, that is, using transistors having an equal transconductance parameter β, the circuit should be so constructed that currents equal to one half the currents flowing individually through the transistors M3 and M4 contribute to the differential output current ΔI. In particular, as shown in FIG. 14, transistors M9 and M10 are connected to the drain of transistor M3; the drain of transistor M9 is connected to the drain of transistor M8; and the power source voltage is supplied to the drain of transistor M10. Further, the gates of transistors M9 and M10 are connected in common to the drain of the transistor M9. Similarly, transistors M11 and M12 are connected to the drain of transistor M4, and the gates of transistors M11 and M12 are connected to the drain of transistor M11. Further, the drain of transistor M11 is connected to the drain of transistor M7, and the power source voltage is supplied to the drain of transistor M12. Here, the transconductance parameters of transistors M3 and M4 are equal to that of the other transistors. By the construction described above, the drain currents flowing through transistors M9 and M11 are equal to one half the currents flowing through transistors M3 and M4, respectively, and the circuit exhibits an input/output characteristic equivalent to that of the circuit shown in FIG. 13.

If it is intended to reduce a transconductance parameter to one half using a single transistor, then a quadruple area is required. Accordingly, with the circuit shown in FIG. 13, an area equal to a total area of 14 transistors whose transconductance parameter is β is required. In contrast, the circuit shown in FIG. 14 requires 12 transistors whose transconductance parameter is β. Anyway, since those circuits include a cascode connection of transistors in three stages, it is difficult to lower the power source voltage to those circuits.

<<Fifth Embodiment>>

Figure 1:
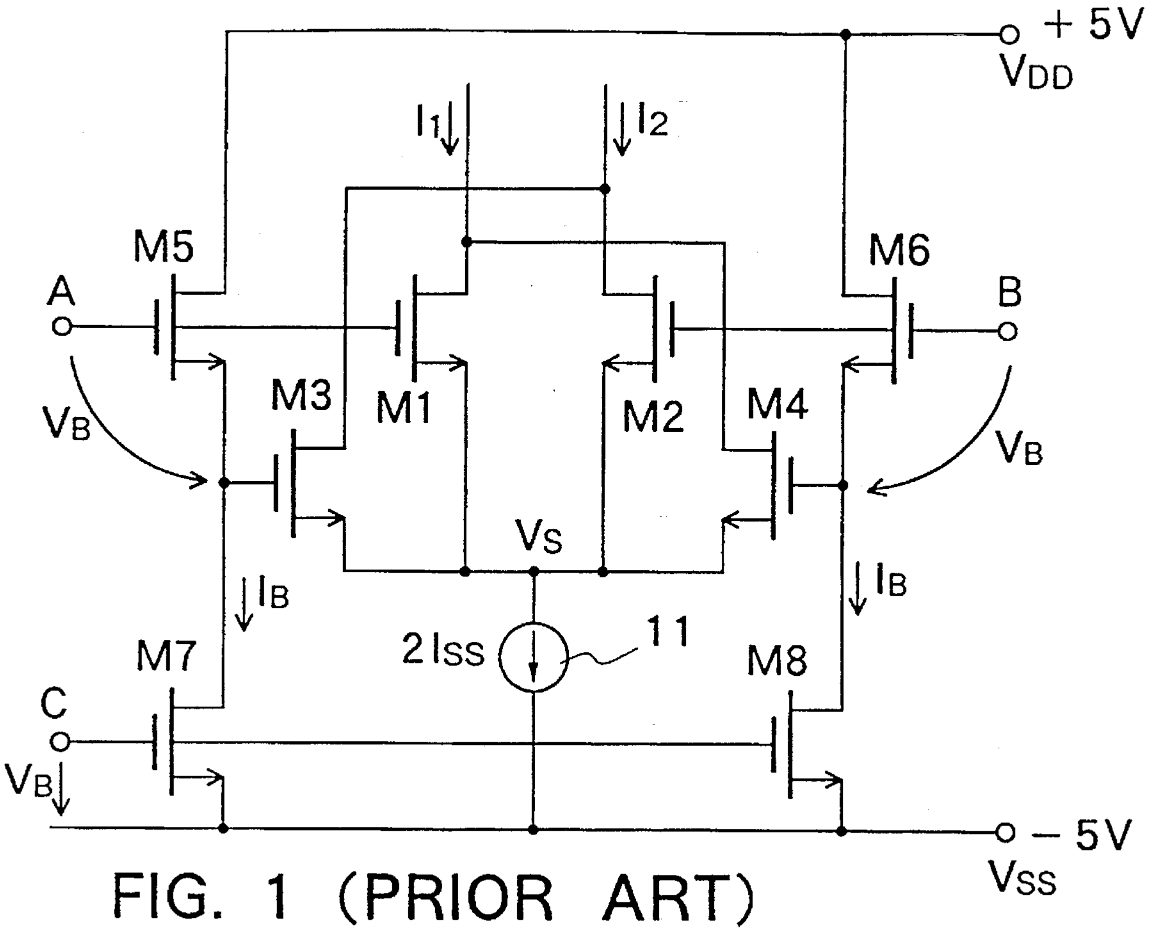
FIG. 1 (PRIOR ART)
FIG. 1 is a circuit diagram of the construction of a conventional tunable MOS OTA.
Figure 2:
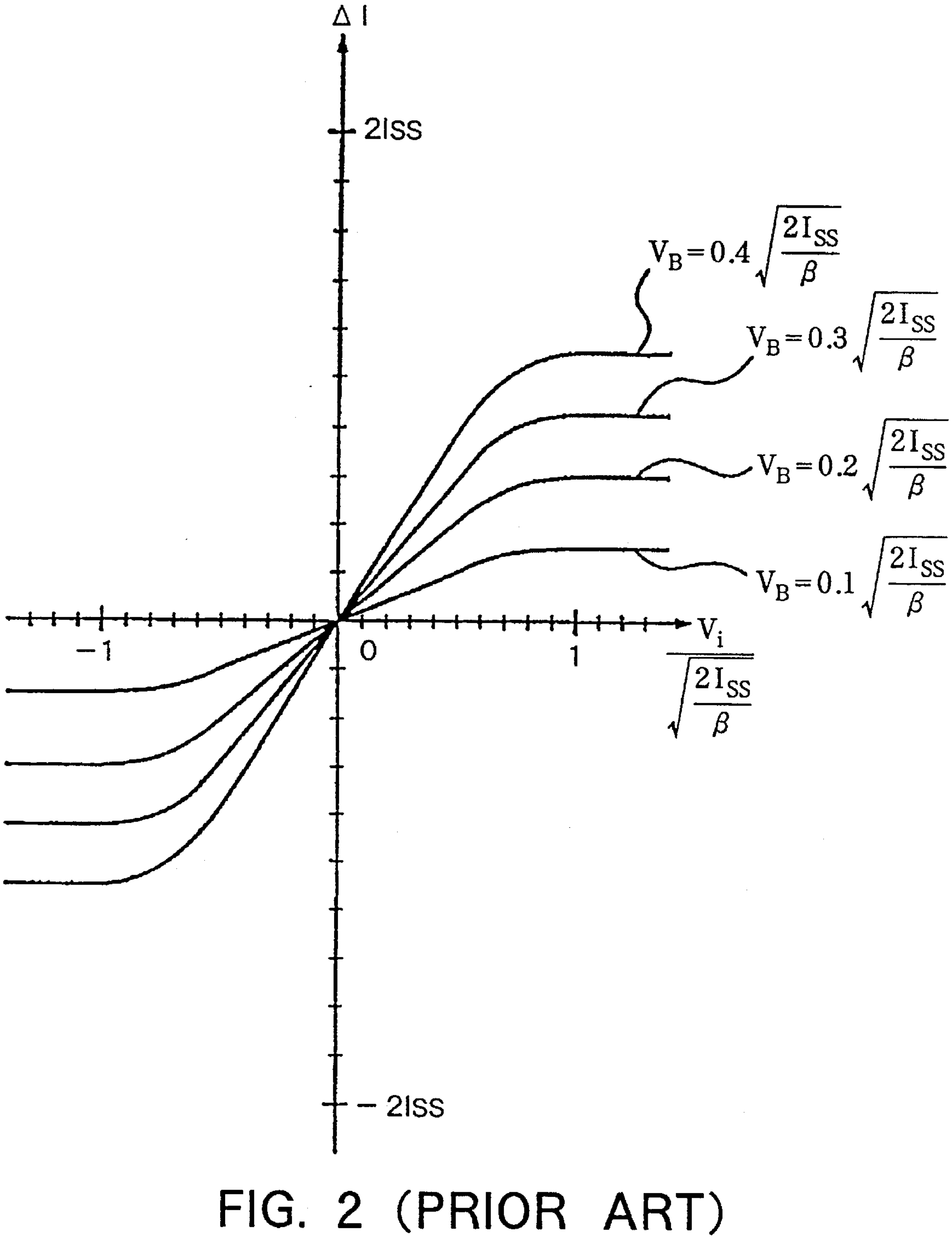
FIG. 2 (PRIOR ART)
FIG. 2 is a graph showing the transfer characteristic of the conventional OTA shown in FIG. 1.
Figure 3:
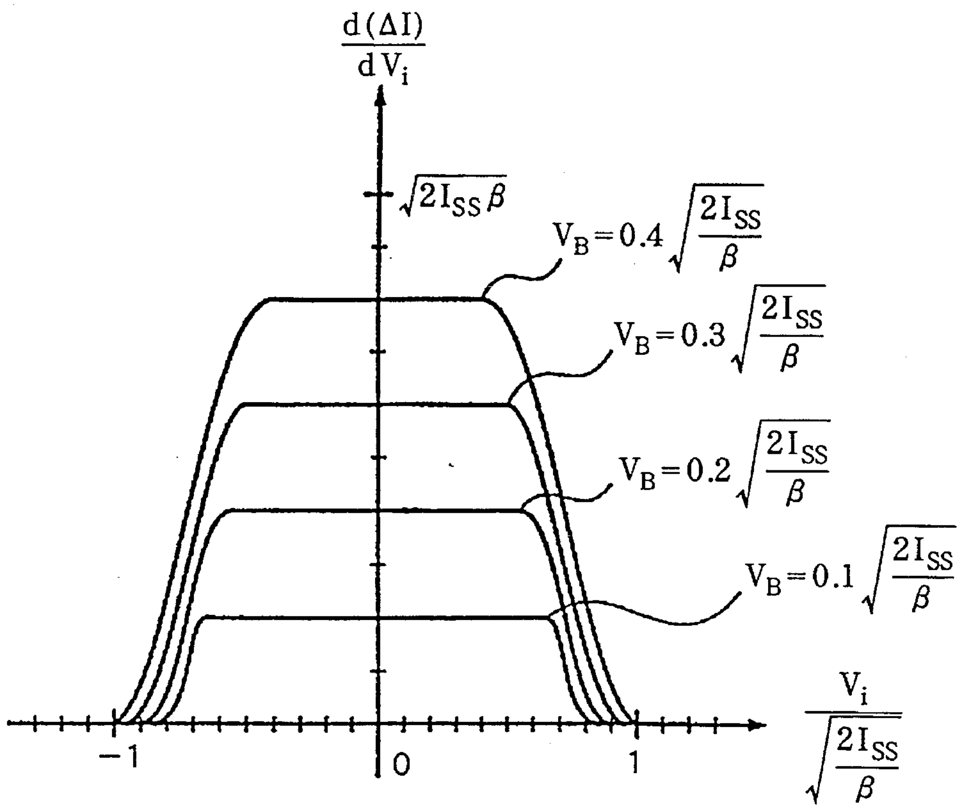
FIG. 3 (PRIOR ART)
FIG. 3 is a graph showing the transconductance characteristic of the conventional OTA shown FIG. 1.

The MOS OTA of the present invention includes a circuit of the type wherein an offset generator as an inputting circuit is added to the quadritail cell circuit by Wang et al. shown in FIG. 1. The offset generator may employ a cascode differential pair wherein transistors are connected in cascode or a cascode quadritail cell which includes a voltage divider.

Figure 15:
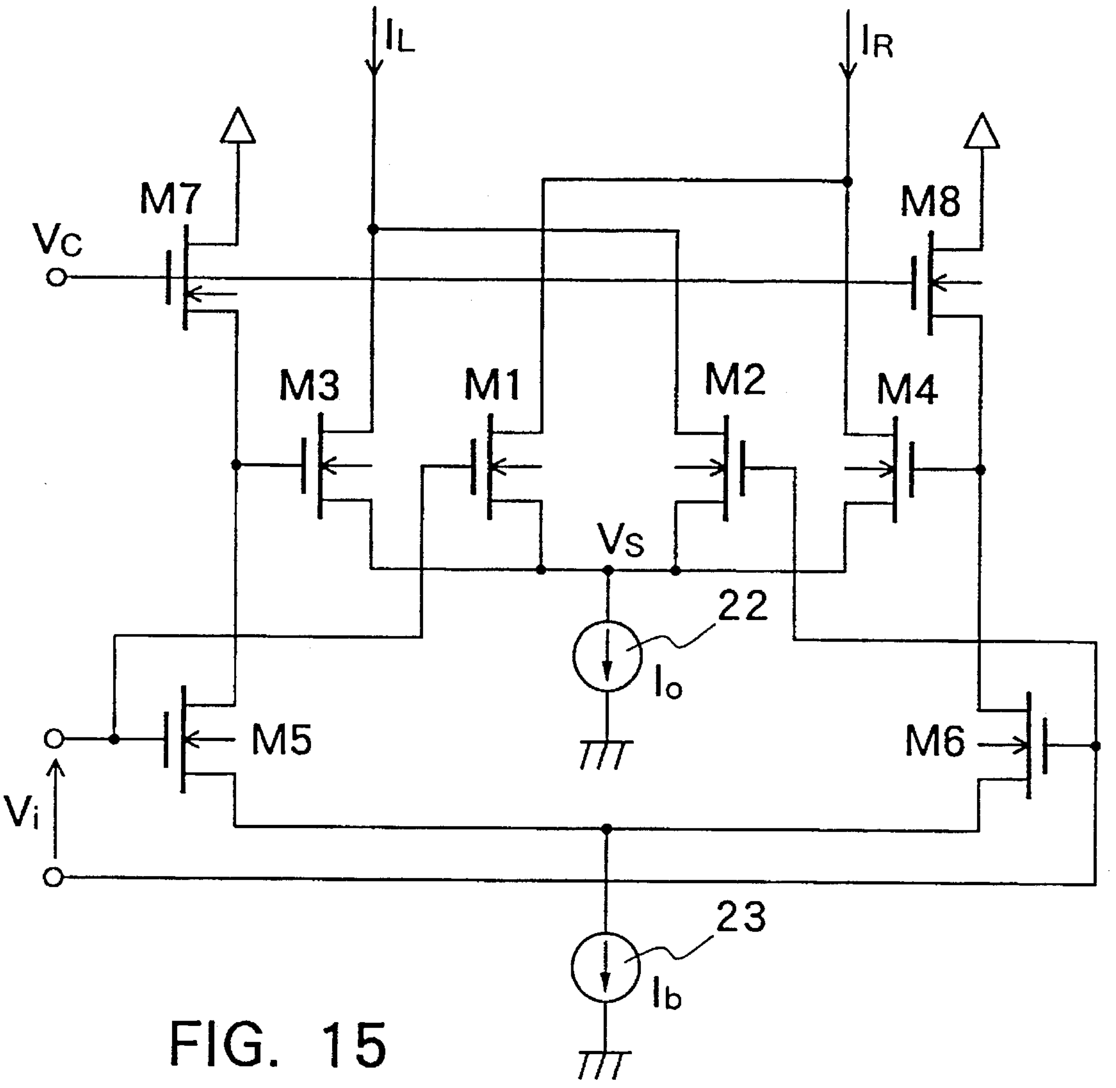
FIG. 15 is a circuit diagram showing the construction of an MOS OTA according to a fifth embodiment of the present invention.

In the MOS OTA shown in FIG. 15, an MOS voltage adder constituted from a cascode differential pair is employed as an inputting circuit, and a tunable offset circuit is realized. The sources of four transistors M1 to M4 are connected to each other and are grounded via a tail current source 22 of a constant current $I_o$. The drains of transistors M1 and M4 are connected to each other, and the sum of drain currents $I_{D1}$ and $I_{D4}$ of transistors M1 and M4 is represented by a current $I_R$. Similarly, the drains of transistors M2 and M3 are connected to each other, and the sum of drain currents $I_{D2}$ and $I_{D3}$ is represented by a current $I_L$. A pair of transistors M5 and M6 whose sources are connected to each other and which are driven by a second tail current source 23 represented by another constant current $I_b$ are provided, and transistors M7 and M8 are connected to the drains of transistors M5 and M6, respectively. A power source voltage is supplied to the drains of transistors M7 and M8, and the gates of transistors M7 and M8 are connected to each other and a tuning voltage $V_C$ is applied to the gates of transistors M7 and M8. The gates of transistors M3 and M4 are connected to the drains of transistors M5 and M6, respectively. The gate of transistor M1 and the gate of transistor M5 are connected to each other, and the gate of transistor M2 and the gate of transistor M6 are connected to each other. A differential input voltage $V_i$ is applied between the gate of transistor M5 and the gate of transistor M6.

In the present circuit, a cascode differential pair is constituted from transistors M5 to M8, and the circuit acts as a voltage adder.

<<Sixth Embodiment>>

Figure 16:
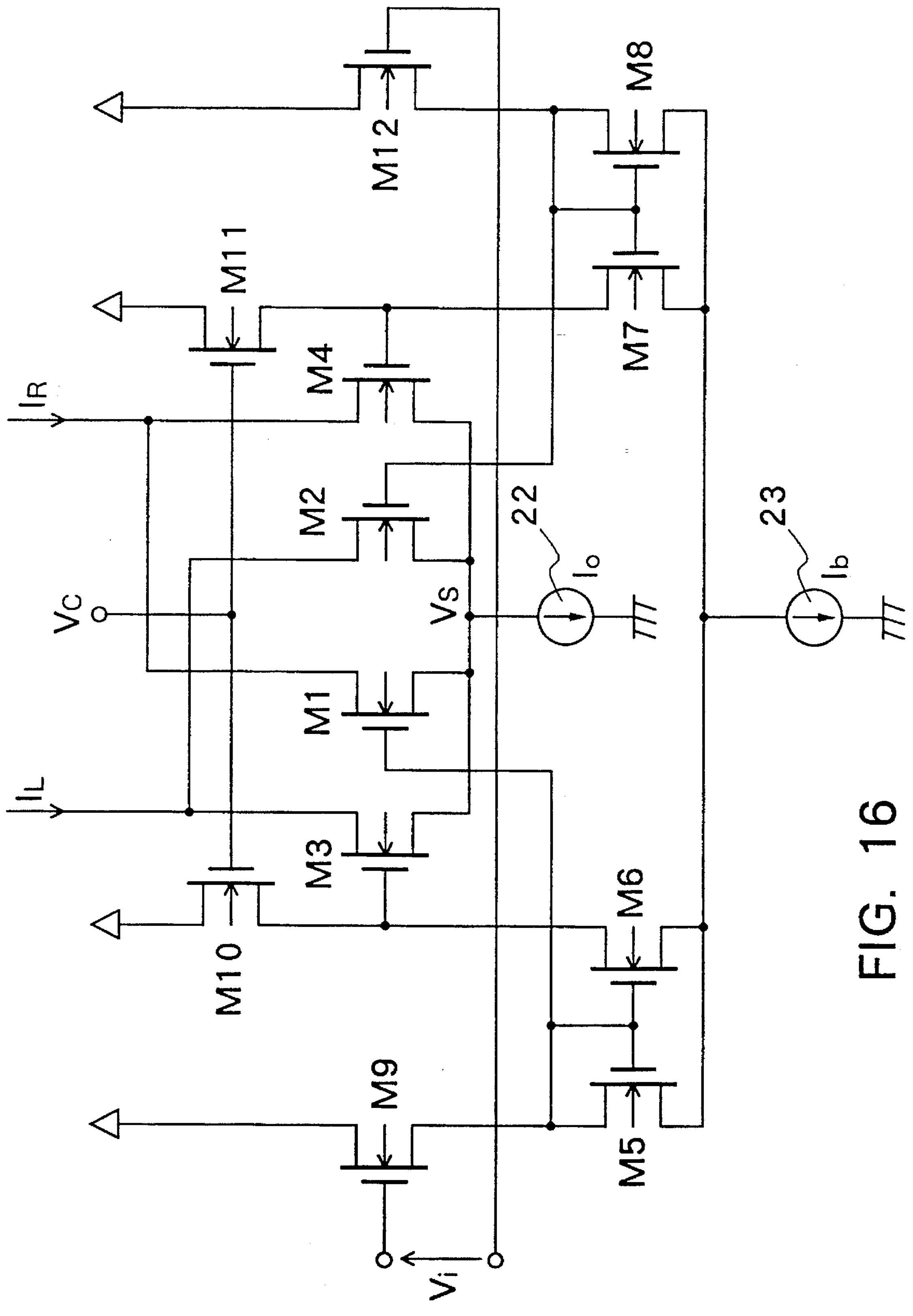
FIG. 16 is a circuit diagram showing the construction of an MOS OTA according to a sixth embodiment of the present invention.

In the MOS OTA shown in FIG. 16, a cascode quadritail cell which includes a voltage divider is employed as an inputting circuit, and a tunable offset circuit is realized. In particular, a quadritail cell is constituted from transistors M1 to M4, and a cascode quadritail cell is constituted from transistors M5 to M12. The sources of transistors M1 to M4 are connected in common to a first tail current source 22 of a constant current $I_o$, and the sources of transistors M5 to M8 are connected in common to another second tail current source 23 of a constant current $I_b$. The drains of transistors M1 and M4 are connected to each other, and the sum of drain currents $I_{D1}$ and $I_{D4}$ of transistors M1 and M4 is represented by a current $I_R$. Similarly, the drains of transistors M2 and M3 are connected to each other, and the sum of drain currents $I_{D2}$ and $I_{D3}$ of transistors M2 and M3 is represented by a current $I_L$.

Transistors M9 to M12 are connected to the drains of transistors M5 to M8, respectively, and a power source voltage is supplied to the drains of transistors M9 to M12. The gates of transistors M1, M5 and M6 are connected in common to the drain of transistor M5, and the gates of transistors M2, M7 and M8 are connected in common to the drain of transistor M8. In particular, a first current mirror circuit is constituted from transistors M5 and M6, and a second current mirror circuit is constituted from transistors M7 and M8. The gates of transistors M3 and M4 are connected to the drains of transistors M6 and M7, respectively. Further, the gates of transistors M11 and M12 are connected to each other, and the tuning voltage $V_C$ is applied to the gates of transistors M11 and M12 while the differential input voltage $V_i$ is applied between the gate of transistor M9 and the gate of transistor M12.

<<Seventh Embodiment>>

The tunable MOS OTAs of the embodiments described above can be used also as MOS two-quadrant multipliers. Examples of the construction of the MOS two-quadrant multiplier according to the present invention are described below.

Example 1

Figure 17:
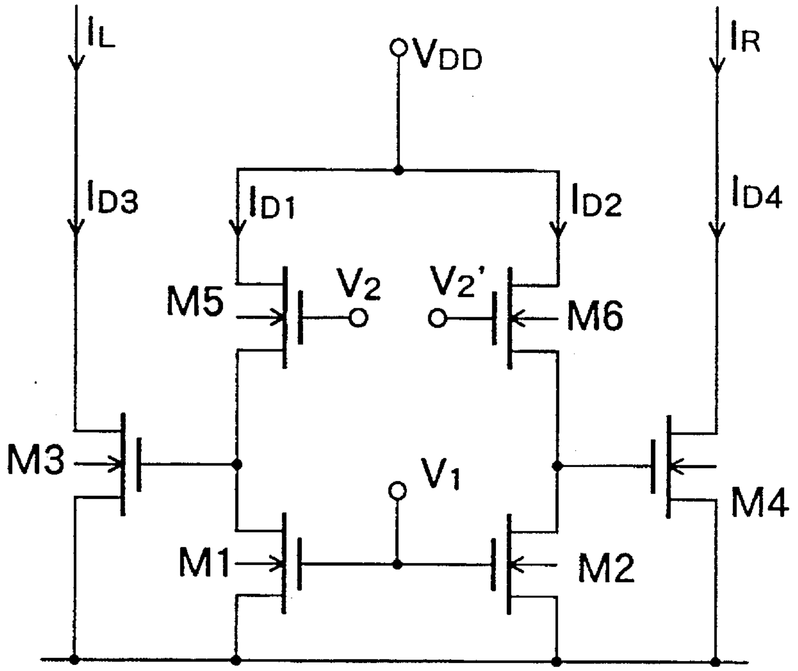
FIG. 17 is a circuit diagram showing an example of the construction of an MOS two-quadrant multiplier according to a seventh embodiment of the present invention.

The MOS two-quadrant multiplier shown in FIG. 17 is equivalent to the construction of the MOS OTA shown in FIG. 5 from which the tail current source is removed. The sources of transistors M1 to M4 are grounded directly, and the gates of transistors M1 and M2 are connected to each other and a first input voltage $V_1$ is applied to the gates of transistors M1 and M2. Meanwhile, voltages $V_2$ and $V_2'$ are inputted as second voltages to the gates of transistors M5 and M6, respectively. The voltages $V_2$ and $V_2'$ define a differential input voltage.

Since $V_{GS1}=V_{GS2}=V_{GS5}=V_{GS6}=V_1$ and $I_{D1}=I_{D2}$ stand with the present circuit, the drain currents $I_{D1}$ to $I_{D4}$ of transistors M1 to M4 are represented as given by the following equations:

$$I_{D1}=I_{D2}=\beta(V_1-V_{TH})^2 \tag{32}$$

$$I_{D3}=\beta(V_2-V_1-V_{TH})^2 \tag{33}$$

$$I_{D4}=\beta(V_2'-V_1'-V_{TH})^2 \tag{34}$$

Accordingly, the differential output current $\Delta I$ is given by $$\begin{aligned}\Delta I &= I_L-I_R \\ &= I_{D3}-I_{D4} \\ &= 2\beta V_i(V_{R1}-V_C-V_{TH})\end{aligned} \tag{35}$$

where $V_1=V_C$, $V_2=V_{R1}-V_i/2$ and $V_2'=V_{R1}+V_i/2$, and $V_{R1}$ is the midpoint voltage of the differential potential $V_i(=V_2-V_2')$. Accordingly, the present two-quadrant multiplier operates linearly.

Examples 2 and 3

Figure 18:
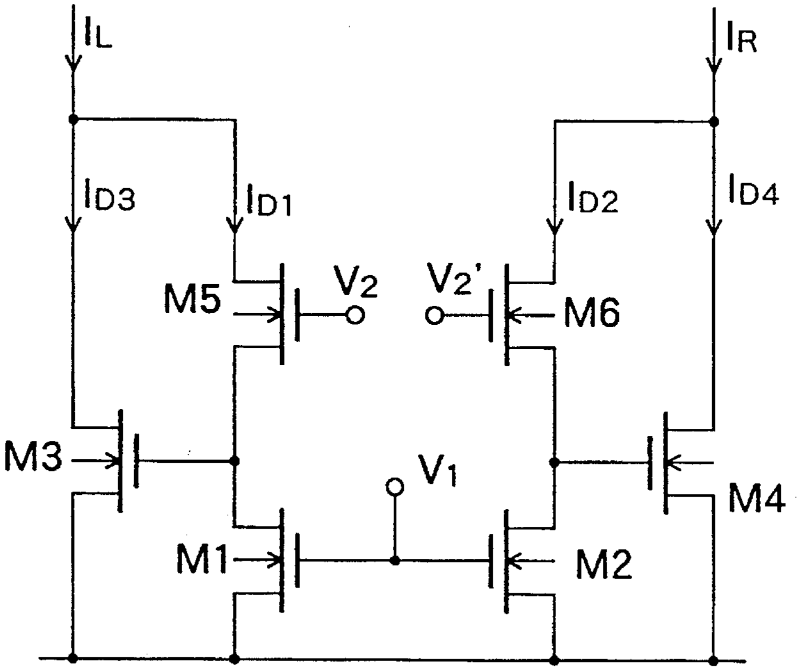
FIGS. 18 to 21 are circuit diagrams individually showing different examples of the construction of the MOS two-quadrant multiplier according to the seventh embodiment of the present invention.
Figure 19:
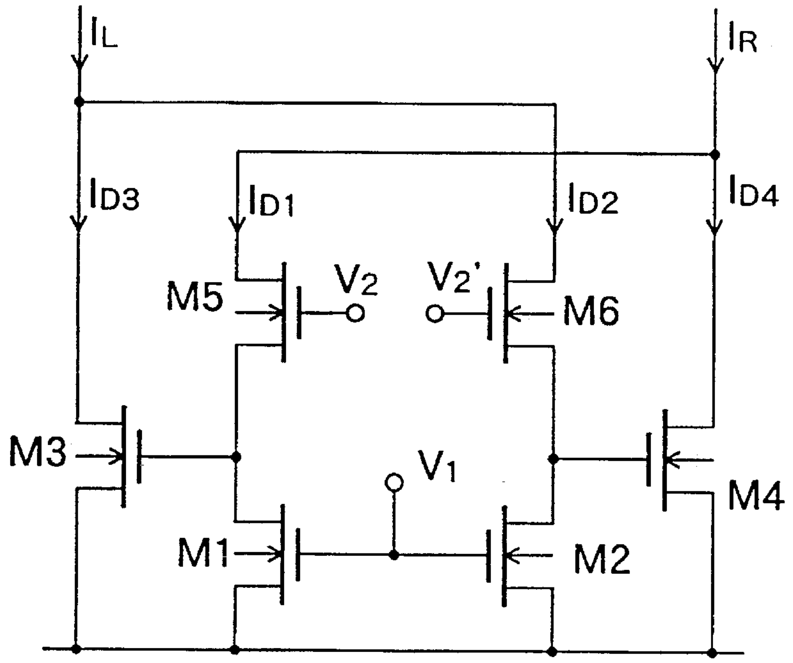

The MOS two-quadrant multipliers of Examples 2 and 3 shown in FIGS. 18 and 19 are modifications to the MOS OTAs shown in FIGS. 6 and 7, respectively, in that the tail current source is removed and the sources of transistors M1 to M4 are grounded directly. Similarly to Example 1 described above, a first input voltage $V_1$ and second input voltages $V_2$ and $V_2'$ as a differential input voltage are applied to the present MOS two-quadrant multipliers. Also with the present circuits, drain currents $I_{D1}$ to $I_{D4}$ of transistors M1 to M4 are represented by equations (32) to (34).

Accordingly, the differential output current $\Delta I$ of the circuit of FIG. 18 is represented as given by $$\begin{aligned}\Delta I &= I_L-I_R \\ &= (I_{D1}+I_{D3})-(I_{D2}+I_{D4}) \\ &= 2\beta V_i(V_{R1}-V_C-V_{TH})\end{aligned} \tag{36}$$

while the differential output current $\Delta I$ of the circuit of FIG. 19 is represented as given by $$\begin{aligned}\Delta I &= I_L-I_R \\ &= (I_{D2}+I_{D3})-(I_{D1}+I_{D4}) \\ &= 2\beta V_i(V_{R1}-V_C-V_{TH})\end{aligned} \tag{37}$$

After all, both of the circuits of FIGS. 18 and 19 have a same input/output characteristic as that of the circuit of FIG. 17, and operate linearly.

Example 4

Figure 8:
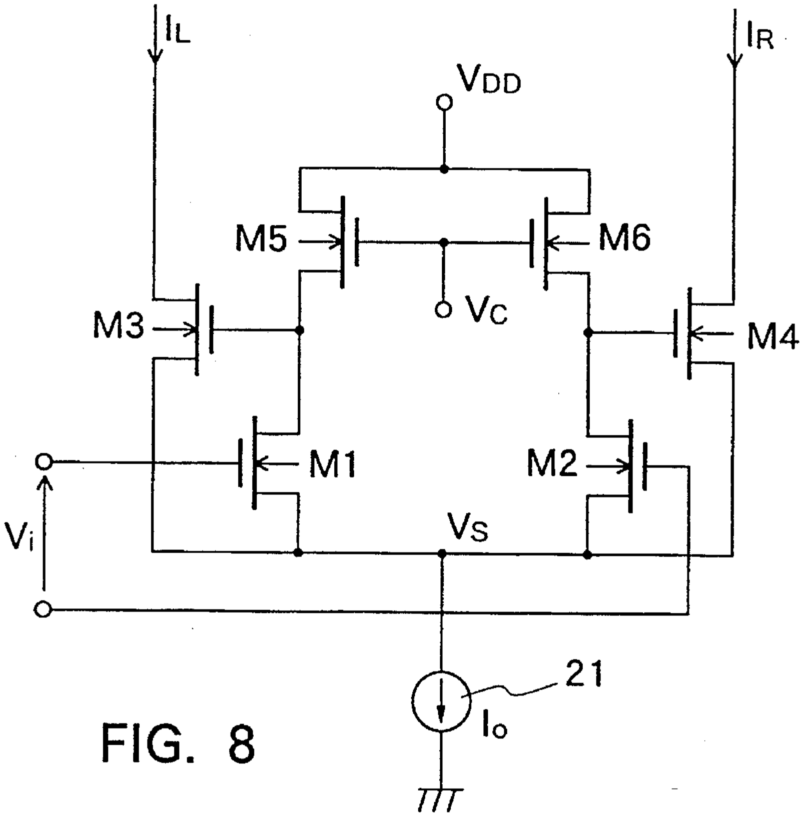
Figure 20:
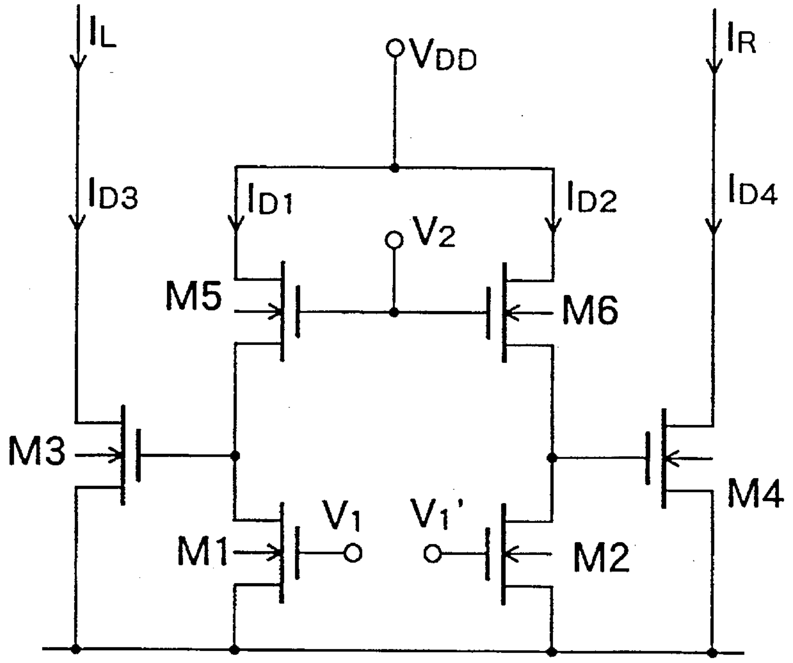

The differential output type MOS two-quadrant multiplier of Example 4 shown in FIG. 20 is a modification in construction to the MOS OTA shown in FIG. 8 in that the tail current source is removed. The sources of transistors M1 to M4 are grounded directly, and input voltages $V_1$ and $V_1'$ are applied to the gates of transistors M1 and M2, respectively. Further, the gates of transistors M5 and M6 are connected to each other, and a second input voltage $V_2$ is applied to the gates of transistors M5 and M6. The input voltages $V_1$ and $V_1'$ constitute a differential input voltage.

In the present circuit, since $V_{GS1}=V_{GS5}=V_1$ and $V_{GS2}=V_{GS6}=V_1'$, the drain currents $I_{D1}$ to $I_{D4}$ of transistors M1 to M4 are represented in the following manner:

$$I_{D1}=\beta(V_1-V_{TH})^2 \tag{38}$$

$$I_{D2}=\beta(V_1'-V_{TH})^2 \tag{39}$$

$$I_{D3}=\beta(V_2-V_1-V_{TH})^2 \tag{40}$$

$$I_{D4}=\beta(V_2-V_1'-V_{TH})^2 \tag{41}$$

Accordingly, the differential output current $\Delta I$ is represented as $$\begin{aligned}\Delta I &= I_L-I_R \\ &= I_{D3}-I_{D4} \\ &= 2\beta V_i(V_{TH}-V_C-V_{R1})\end{aligned} \tag{42}$$

where $V_1=V_{R1}+V_i/2$, $V_1'=V_{R1}-V_i/2$ and $V_2=V_C$.

Example 5

Figure 21:
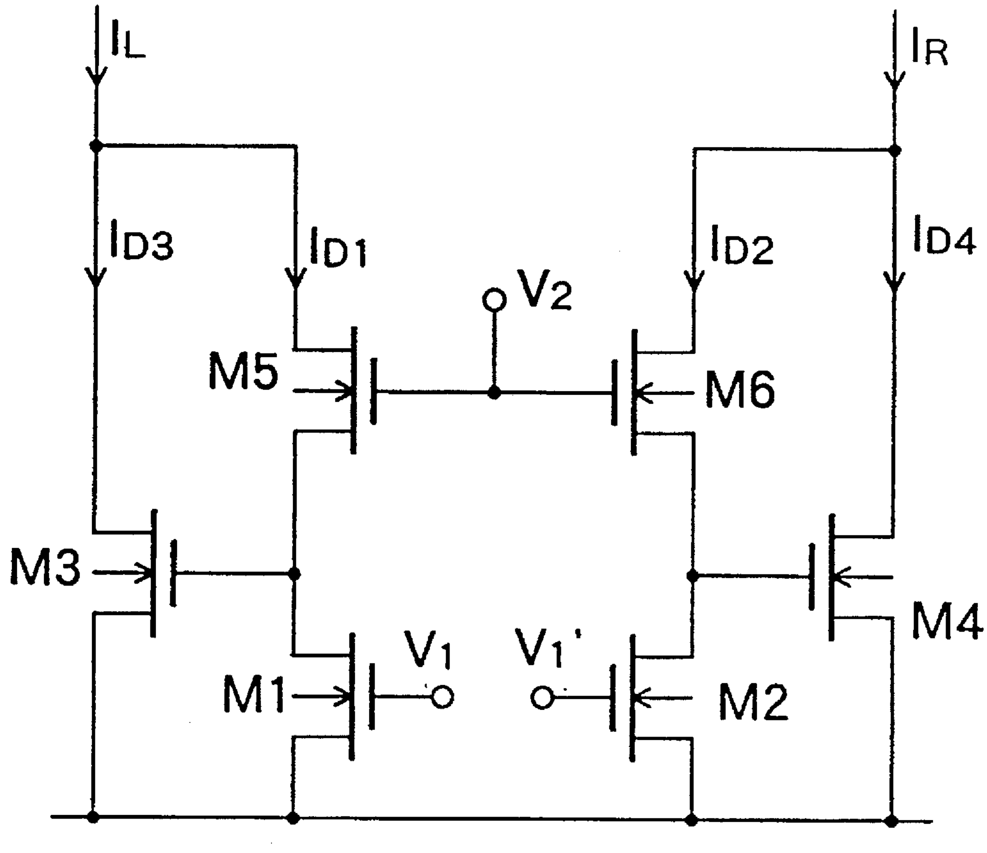

The balanced MOS two-quadrant multiplier of Example 5 shown in FIG. 21 is a modification to the MOS OTA shown in FIG. 9 in that the tail current source is removed. The sources of the transistors M1 to M4 are grounded directly, and input voltages $V_1$ and $V_1'$ are applied to the gates of transistors M1 and M2, respectively. Further, the gates of transistors M5 and M6 are connected to each other, and a second input voltage $V_2$ is applied to the gates of transistors M5 and M6. The input voltages $V_1$ and $V_1'$ define a differential input voltage. Since drain currents $I_{D1}$ to $I_{D4}$ of transistors M1 to M4 are represented as given by equations (38) to (41) above, the differential output current of the present circuit is represented as $$\begin{aligned} \Delta I &= I_L - I_R \\ &= (I_{D1} + I_{D3}) - (I_{D2} + I_{D4}) \\ &= 2\beta V_i(2V_{R1} - V_C) \end{aligned} \quad (43)$$

Accordingly, the present multiplier has a circuit characteristic which depends upon a voltage applied thereto without being influenced by the threshold voltage $V_{TH}$. In other words, the present multiplier operates equivalently to a differential pair having floating inputs. Further, the power source voltage can be made lower as the sources of the transistors are grounded.

Figure 4:
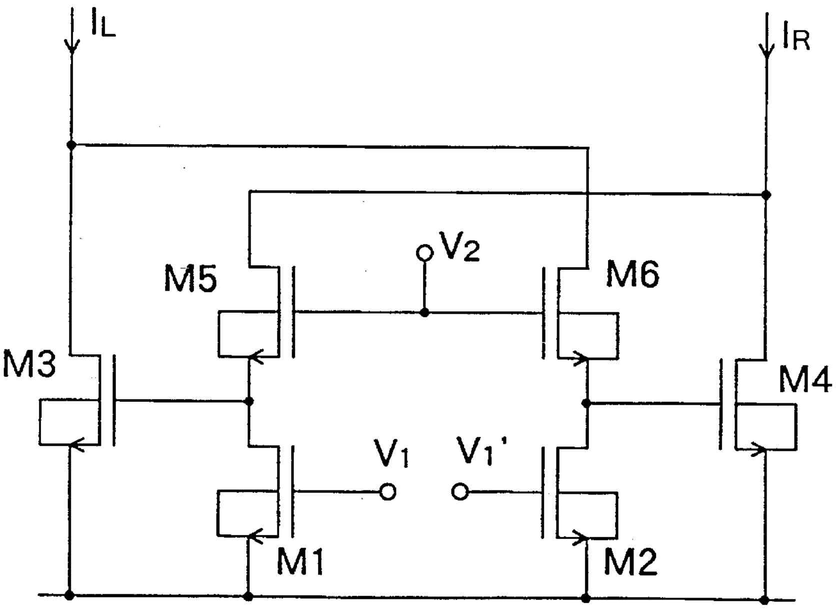
FIG. 4 (PRIOR ART)
FIG. 4 is a circuit diagram showing the construction of a conventional MOS two-quadrant multiplier.

The unbalanced two-quadrant multiplier (refer to FIG. 4) proposed by K. Bult and H. Wallinga can be regarded as a circuit which includes a combination of two sets of voltage-controlled V-I converter circuits. For a circuit of the type just mentioned, two methods for applying an input voltage and three methods of obtaining an output differential current are available similarly as described hereinabove in connection with the first embodiment, and totaling six different circuits can be provided by combinations of them. While K. Bult and H. Wallinga discloses only one of the six possible circuits, the remaining five circuits are disclosed in Examples 1 to 5 described above. It is to be noted that the differential output current ΔI of the circuit by K. Bult and H. Wallinga includes a term of the threshold voltage $V_{TH}$ as seen from equation (13). This similarly applies to the circuits shown in FIGS. 17 to 20.

Although certain preferred embodiments of the present invention have been shown and described in detail, it should be understood that various changes and modifications may be made therein without departing from the scope of the appended claims.

What is claimed is:

1. A tunable MOS operational transconductance amplifier which outputs a differential output current in response to a differential input voltage, comprising:

a tail current source;

first and second transistor pairs having commonly connected sources and driven by said tail current source; and a third transistor pair connected in cascode to said first transistor pair and serving as loads to said first transistor pair;

gates of said second transistor pair being connected to drains of said first transistor pair, respectively.

2. The tunable MOS operational transconductance amplifier according to claim 1, wherein the drains of said second transistor pair and the drains of said third transistor pair are cross-coupled.

3. The tunable MOS operational transconductance amplifier according to claim 1, wherein the drains of said second transistor pair and the drains of said third transistor pair are connected in parallel.

4. The tunable MOS operational transconductance amplifier according to claim 1, wherein the drain currents of said third transistor pair are not included in the differential output current, and a power source voltage is applied to the drains of said third transistor pair.

5. The tunable MOS operational transconductance amplifier according to claim 1, wherein the tuning voltage is applied to the gates of said first transistor pair which are connected to each other, and the differential input voltage is applied between the gates of said third transistor pair.

6. The tunable MOS operational transconductance amplifier according to claim 1, wherein the differential input voltage is applied between the gates of said first transistor pair, and the gates of said third transistor pair are connected to each other.

7. The tunable MOS operational transconductance amplifier according to claim 6, wherein a voltage from the commonly connected sources of said first and second transistor pairs is coupled as tuning voltage to the gates of said third transistor pair.

8. The tunable MOS operational transconductance amplifier according to claim 6, further comprising an operational amplifier for adding a voltage inputted thereto to a voltage from the commonly connected sources of said first and second transistor pairs and outputting a voltage obtained by the addition, an output of said operational amplifier being applied as the tuning voltage to the gates of said third transistor pair.

9. The tunable MOS operational transconductance amplifier according to claim 6, further comprising a first auxiliary transistor having a diode connection and connected to a common node of the gates of said third transistor pair, and a second auxiliary transistor interposed between the common sources of said first and second transistor pairs and the common node, the gate of said second auxiliary transistor being connected to the respective gates of said first transistor pair through a pair of resistors.

10. The tunable MOS operational transconductance amplifier according to claim 6, further comprising a fourth transistor pair interposed between said first transistor pair and said third transistor pair, each of transistors which constitute said fourth transistor pair having a diode connection, transistors which constitute said second transistor pairs having transconductance parameters different from transconductance parameters of transistors which constitute the other transistor pairs.

11. The tunable MOS operational transconductance amplifier according to claim 10, wherein the transconductance parameters of the transistors which constitute said second transistor pair are equal to one half the transconductance parameters of the transistors which constitute the other transistor pairs.

12. The tunable MOS operational transconductance amplifier according to claim 10, wherein the transconductance parameters are made different by making a ratio between a width and a length of a gate different between said transistors.

13. The tunable MOS operational transconductance amplifier according to claim 6, further comprising a fourth transistor pair interposed between said first transistor pair and said third transistor pair, each of the transistors which constitute said fourth transistor pair having a diode connection, halves of drain currents of the transistors which constitute said second transistor pair relating to the differential output current.

14. The tunable MOS operational transconductance amplifier according to claimed in claim 13, wherein a pair of transistors is connected to each of the drains of the transistors which constitute said second transistor pair to divide drain currents of the transistors which constitute said second transistor pair into two.

15. The tunable MOS operational transconductance amplifier of claim 1, wherein a tuning voltage is applied to the gates of said first transistor pair, and a differential input voltage is applied between the gates of said third transistor pair, and wherein the differential output current includes at least drain currents of said second transistor pair.

16. The tunable MOS operational transconductance amplifier of claim 1, wherein a tuning voltage is applied to the gates of said third transistor pair, and a differential input voltage is applied between the gates of said first transistor pair, and wherein the differential output current includes at least drain currents of said second transistor pair.

17. A tunable MOS operational transconductance amplifier which outputs a differential output current in response to a differential input voltage, comprising:

a first tail current source;

a second tail current source;

first and second transistor pairs having drains cross-coupled to each other and having sources connected commonly to said first tail current source; and a differential pair constituted from transistors connected in cascode and connected to said second tail current source;

gates of transistors on upper stage side constituting said differential pair being connected in common to be applied a tuning voltage thereto, sources of said transistors on the upper stage side being connected to the gates of said first transistor pair, respectively, gates of transistors on lower stage side which constitute said differential pair being connected to gates of said second transistor pair, respectively.

18. The tunable MOS operational transconductance amplifier according to claim 17, wherein a second differential pair constituted from transistors connected in cascode is added to said differential pair, transistors on lower stage side of each of the differential pairs having a diode connection, the differential input voltage being applied between gates of transistors on upper stage side of said second differential pair, sources of the transistors on the upper stage side of said second differential pair being connected to the gates of said second transistor pair.

19. A tunable MOS two-quadrant multiplier which outputs a differential output current in response to the product of values of two input voltages, comprising:

first and second transistor pairs having sources grounded commonly; and a third transistor pair connected in cascode to said first transistor pair and serving as loads to said first transistor pair;

gates of said second transistor pair being individually connected to drains of said first transistor pair;

a differential input voltage being applied as a first input voltage between gates of said third transistor pair, a second input voltage being applied to gates of said first transistor pair which are connected commonly, the differential output current including at least drain currents of said second transistor pair.

20. A tunable MOS two-quadrant multiplier which outputs a differential output current in response to the product of values of two input voltages, comprising:

first and second transistor pairs having sources grounded commonly; and a third transistor pair connected in cascode to said first transistor pair and serving as loads to said first transistor pair;

drains of said second transistor pair being connected not in cross-coupling to drains of said third transistor pair;

gates of said second transistor pair being individually connected to drains of said first transistor pair;

a differential input voltage being applied as a first input voltage between gates of said first transistor pair, a second input voltage being applied to gates of said third transistor pair which are connected commonly, the differential output current including at least drain currents of said second transistor pair.

21. The tunable MOS two-quadrant multiplier according to claim 20, wherein the drains of said second transistor pair and drains of said third transistor pair are connected in parallel.

* * * * *